(12) United States Patent
Asanaka (10) Patent No.: US 6,671,315 B1
(45) Date of Patent: Dec. 30, 2003

(54) DTMF SIGNAL GENERATOR

(75) Inventor: Kazunori Asanaka, Tokyo (JP)

(73) Assignee: Uniden Corporation, Tokyo (JP)

( * ) Notice: Subject to any disclaimer, the term of this patent is extended or adjusted under 35 U.S.C. 154(b) by 0 days.

(21) Appl. No.: 09/492,434

(22) Filed: Jan. 27, 2000

(30) Foreign Application Priority Data

Jul. 8, 1999 (JP) .......................................... 11-194079

(51) Int. Cl.⁷ .............................................. H03K 09/08
(52) U.S. Cl. ......................... 375/238; 379/361; 379/362
(58) Field of Search ................................ 375/238, 239, 375/237, 296, 260, 278, 284, 285; 370/525, 526; 379/361, 362, 357.03, 353, 283, 357.04, 386, 352, 142.18, 359, 341, 357.05

(56) References Cited

U.S. PATENT DOCUMENTS

| | | | |
|---|---|---|---|
| 4,390,754 A | 6/1983 | Holberg | 327/107 |
| 4,571,723 A * | 2/1986 | Lusignan et al. | 370/525 |
| 4,639,554 A | 1/1987 | Masuda et al. | 340/365.5 |
| 5,027,389 A | 6/1991 | Chiue et al. | 379/361 |
| 5,398,031 A | 3/1995 | Saji | 341/173 |
| 5,644,098 A * | 7/1997 | Jenkins et al. | 84/624 |
| 5,698,805 A * | 12/1997 | Thompson et al. | 84/615 |
| 5,802,187 A * | 9/1998 | Hsu | 381/119 |
| 5,838,210 A * | 11/1998 | Midya et al. | 332/109 |
| 5,859,905 A * | 1/1999 | Wu et al. | 379/361 |
| 5,889,853 A * | 3/1999 | Wu | 379/361 |
| 5,978,388 A * | 11/1999 | Park | 370/525 |
| 6,400,821 B1 * | 6/2002 | Burgan et al. | 379/361 |

* cited by examiner

Primary Examiner—Mohammad H. Ghayour
Assistant Examiner—Khanh Cong Tran
(74) Attorney, Agent, or Firm—Sidley Austin Brown & Wood LLP (57) ABSTRACT

A DTMF signal generator simplifies frequency characteristic design of a telephone line interface so as to make it easy to carry out alteration of a low tone group frequency component and a high tone group frequency component of a DTMF signal, and to lower cost by doing away with the need for a D/A converter. There are provided first and second sine wave generators (201 and 202) for respectively generating sine waves of specific frequencies, a combining circuit (210) for combining and outputting the outputs of the first and second sine wave generators at a specified ratio, a PWM modulator (214) for generating pulses at a width corresponding to the output of the combining circuit, and a filter (211) for removing undesired frequency components included in the output of the PWM modulator. The combining ratio of the combining circuit is variable.

18 Claims, 10 Drawing Sheets

SINE WAVE COMBINING CIRCUIT

FIG.4

SINE WAVE COMBINING CIRCUIT

FIG.5

ANALOG LOW PASS FILTER

FIG.6

DTMF OUTPUT SPECTRUM (FPGA OUTPUT)

402 PCM SINE WAVE
401 ANALOG SINE WAVE

PCM TONE SIGNAL (TIME AXIS)

FIG.10

PCM TONE SIGNAL (FREQUENCY AXIS)

FIG.11

FIG.12

DTMF SIGNAL GENERATOR

BACKGROUND OF THE INVENTION

1. Field of the Invention

The present invention relates to a DTMF (Dual Tone Multiple Frequency) tone signal generator mainly used in information communication devices.

2. Description of the Related Art

Figure 11:
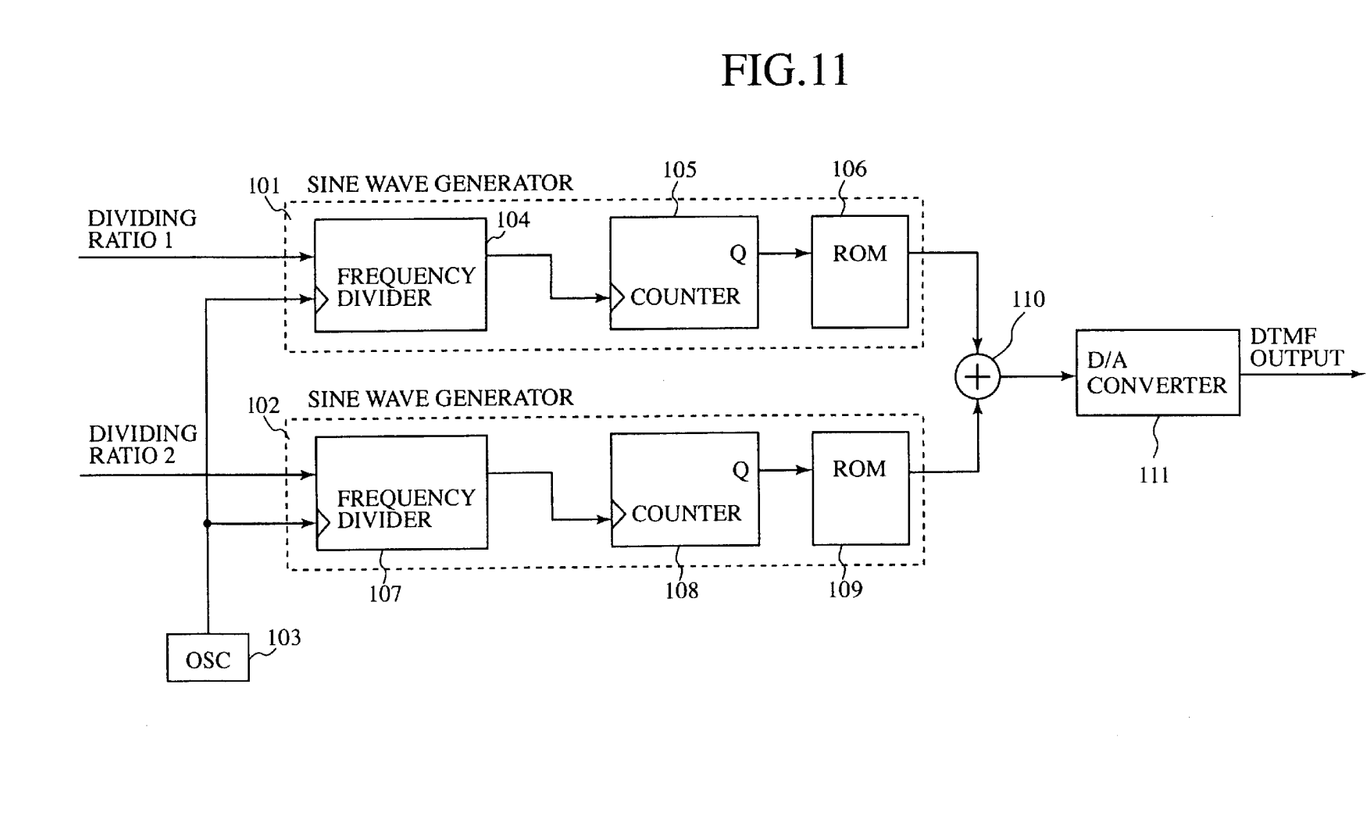
FIG. 11 shows a DTMF tone signal generator of the related art.

An example of a conventional DTMF generator is shown in FIG. 11. Sine waves are generated by two sine wave generators 101 and 102. These two sine waves are combined at a fixed ratio by an adder 110, and a DTMF signal is obtained by converting the added digital signal to an analog signal using a D/A converter 111.

The sine wave generators 101 and 102 respectively comprise clock (frequency) dividers 104 and 107, counters 105 and 108, and Read-Only Memories (ROMs) 106 and 109 storing waveform data for one cycle. The frequency dividers 104 and 107 divide an output signal (clock) of an oscillator (OSC) 103 based on externally provided dividing ratio 1 and dividing ratio 2. The counters 105 and 108 count based on the outputs of the frequency dividers 104 and 107, and data from the counters 105 and 108 is outputted to the ROMs 106 and 109 as addresses. The ROMs 106 and 109 output waveform data corresponding to the received addresses.

Figure 12:
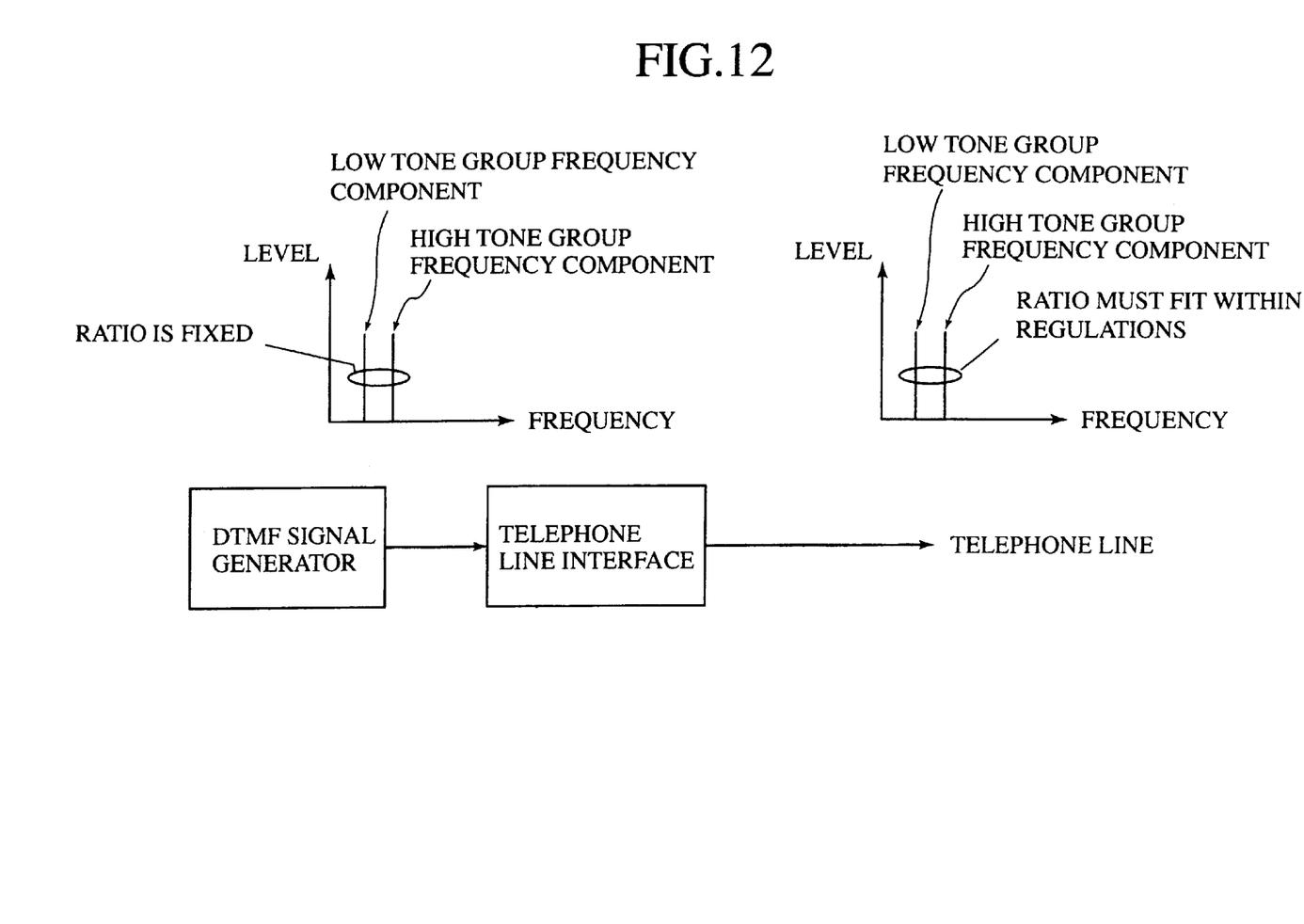
FIG. 12 is a drawing for explaining the operation of the DTMF tone signal generator of the related art.

As shown in FIG. 12, a DTMF signal is made up of a low tone group frequency component and a high tone group frequency component. There is a constraint that the ratio of the high tone group frequency to the low tone group frequency must be within the regulations of the telephone line. With the DTMF generator of FIG. 11, it was not possible to freely vary the ratio of the signal levels of the two sine waves of the DTMF signal output to the telephone line. As a result, there was a problem that the permissible range for the frequency characteristic of a telephone line interface was narrow, increasing cost.

In addition, in a system of the related art, a D/A converter was required, and so the cost of LSI (Large-Scale Integration) for the DTMF signal generator was increased.

SUMMARY OF THE INVENTION

The present invention was conceived in view of the above described problems, and the object of the present invention is to increase the permissible range for the frequency characteristic required of a telephone line interface, and to lower the cost of a DTMF generator.

According to the present invention, the aforementioned objects are attained by a DTMF generator, comprising a first sine wave generator and a second sine wave generator for respectively generating sine waves of specified frequencies, and a combining circuit for combining and outputting outputs from the first and second sine wave generators at a specified ratio, where a combining ratio of the combining circuit is variable.

The present invention is preferably also provided with a PWM (Pulse Width Modulation) circuit for generating a pulse of a width corresponding to the output of the combining circuit, and a filter for removing unnecessary frequencies included in an output from the PWM modulator.

DESCRIPTION OF THE PREFERRED EMBODIMENT

Embodiment 1

Figure 1:
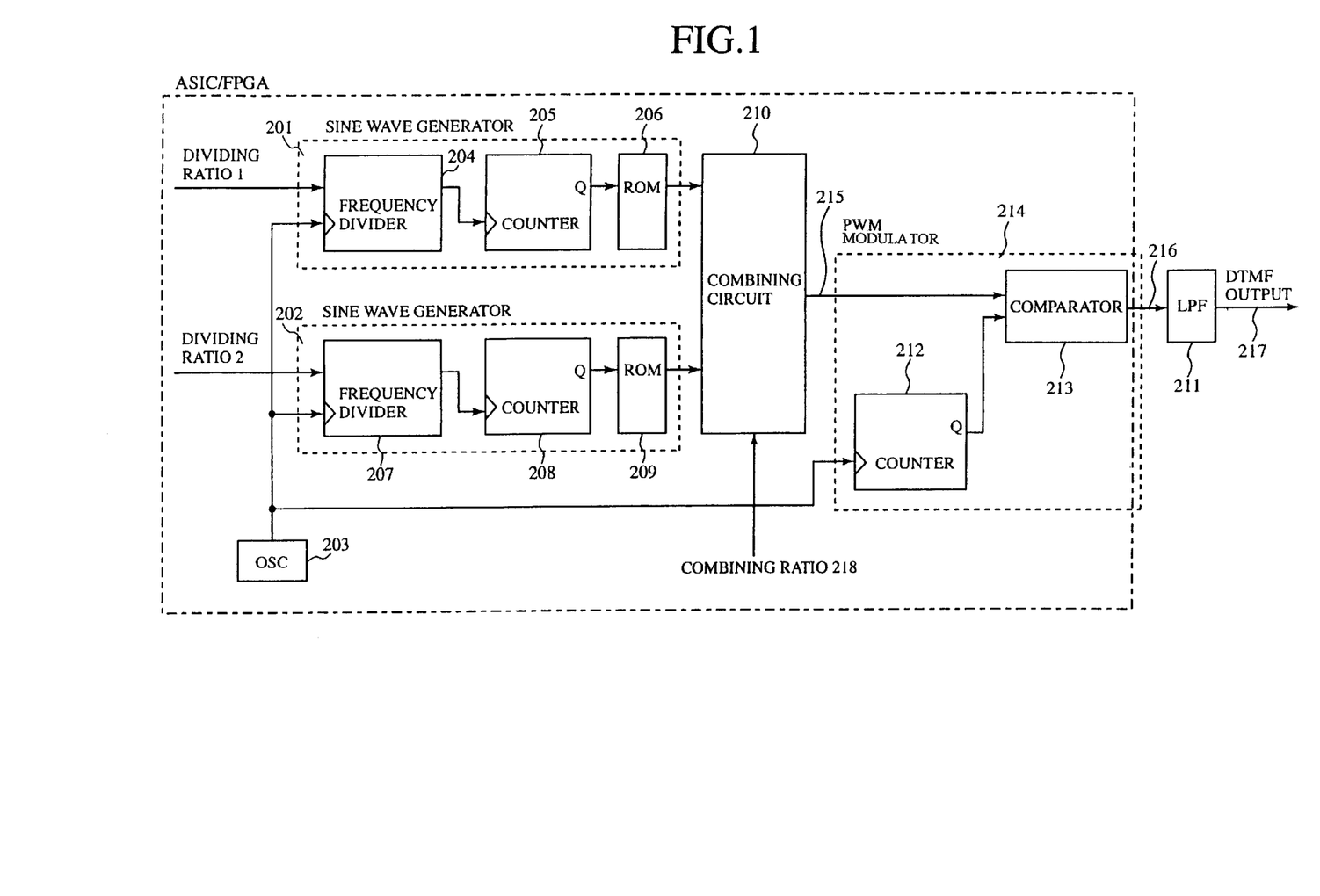
FIG. 1 is a block diagram of a DTMF tone signal generator of a first embodiment of the present invention.

A DTMF signal generator of Embodiment 1 of the present invention is shown in FIG. 1. In FIG. 1, the DTMF signal generator is incorporated into an ASIC (Application Specific Integrated Circuit) or an FPGA. Sine wave generators 201 and 202, an oscillator 203, a combining circuit 210 and a PWM modulator 214 are formed in the ASIC/FPGA.

The sine wave generators 201 and 202 respectively comprise clock (frequency) dividers 204 and 207, counters 205 and 208, and ROMs 206 and 209 storing waveform data for 1 cycle. The frequency dividers 204 and 207 respectively divide an output signal (clock) of an oscillator (OSC) 203 based on externally provided dividing ratio 1 and dividing ratio 2. The counters 205 and 208 execute counting based on the outputs of the frequency dividers 204 and 207, and data from the counters 205 and 208 is output to the ROMs 206 and 209 as addresses. The ROMs 206 and 209 output waveform data corresponding to the received addresses.

If the clock frequency generated by the oscillator 203 is designated fx, the dividing ratio of the frequency dividers 204 and 207 is designated N and the period of the counters 205 and 208 is designated M, the frequency fs of the obtained sine waves can be expressed as fs=fx/M/N. When a sine wave of frequency fs is to be generated, the dividing ratio N is set to N=fx/M/fs. 206 and 209 are not limited to ROMs, and can also be wired logic or Random Access Memory (RAMs).

The combining circuit 210 combines the output of the sine wave generator 201 and the output of the sine wave generator 202 at a specified ratio based on an externally supplied combining ratio 218, and outputs the result to the PWM modulator 214.

Figure 2:
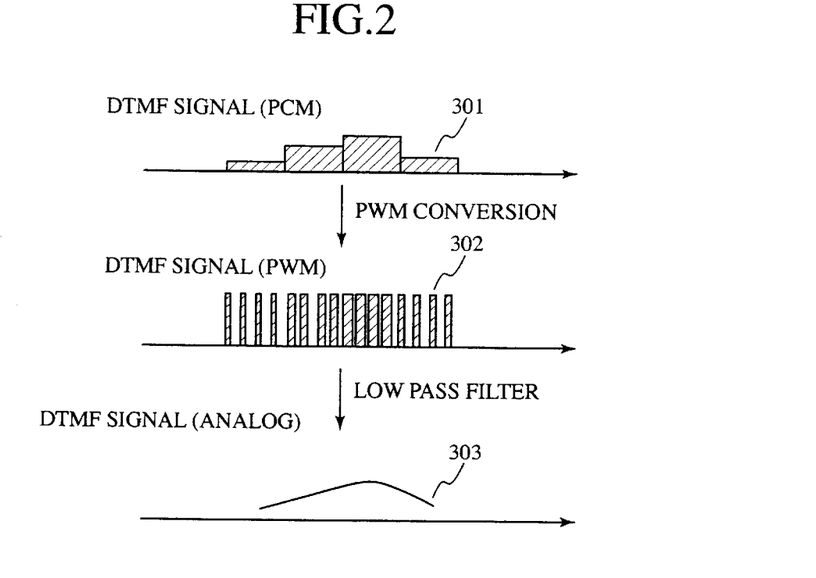
FIG. 2 is an explanatory view showing the operation of a device of the first embodiment of the present invention.

The PWM modulator 214 comprises a counter 212, for executing a counter operation using output of the oscillator 203, and a comparator 213 for comparing the output of the combining circuit 210 and the output of the counter 212. The PWM modulator 214 compares a value of a PCM (Pulse Code Modulation) DTMF signal 215 (301 in FIG. 2) and a value of the counter 212 in the comparator 213, and outputs a "1" if the value of the DTMF signal 215 is larger than the value of the counter 212, or outputs a "0" if this is not the case. In this way a string of pulses 302 (See FIG. 2) having widths proportional to the value of the PCM DTMF signal is obtained. The PWM modulated DTMF signal 216 (302 in FIG. 2) is a digital signal containing only "1"s and "0"s, so there is no need for a D/A converter.

Two types of sine waves are generated by the two sine wave generators 201 and 202, and then a PCM DTMF signal 215 is formed by the combining circuit 210, by combining these two sine waves in a proportion corresponding to a combining ratio 218, and a PWM modulated DTMF signal 216 is formed by the PWM modulator 214, by carrying out PWM modulation.

By passing this PWM modulated DTMF signal 216 through the low pass filter 211 that is external to the ASIC/FPGA, it is possible to obtain a DTMF signal 217 from which the carrier frequency has been removed. Specifically, an analog DTMF output 217 (303 in FIG. 2) from which the carrier frequency has been removed is obtained by passing the PWM modulated DTMF signal 216 (302 in FIG. 2) through an analog low pass filter 211 which is external to the ASIC/FPGA.

Next, a device employing the embodiment of the present invention will be described in detail.

Figure 3:
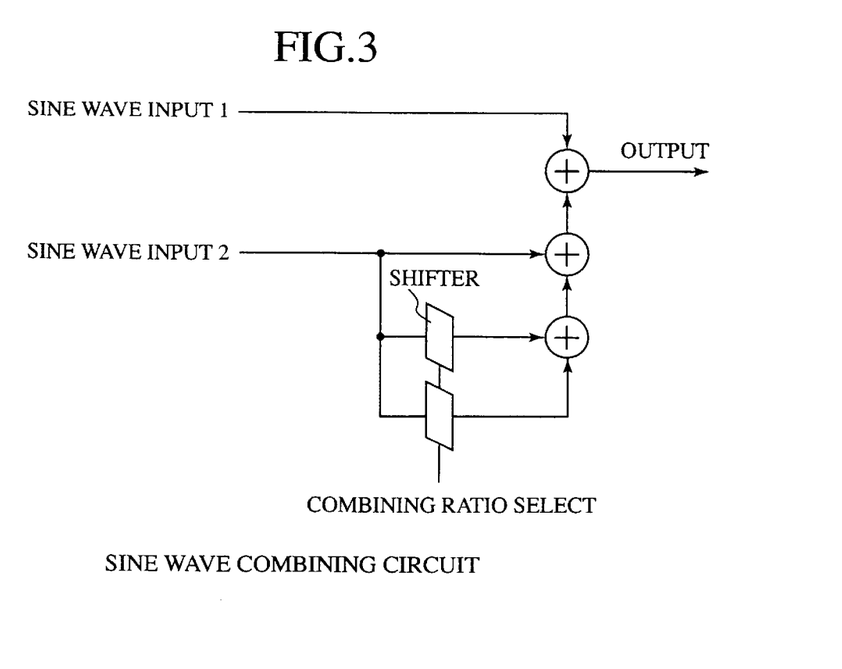
FIG. 3 shows an example of a sine wave combining circuit of the DTMF tone signal generator of the first embodiment of the present invention.
Figure 4:
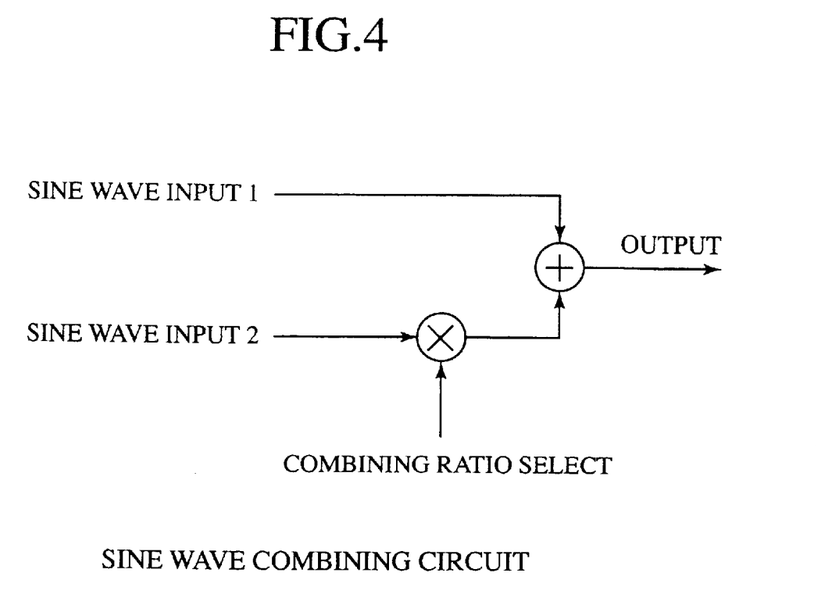
FIG. 4 shows another example of a sine wave combining circuit of the DTMF tone signal generator of the first embodiment of the present invention.
Figure 5:
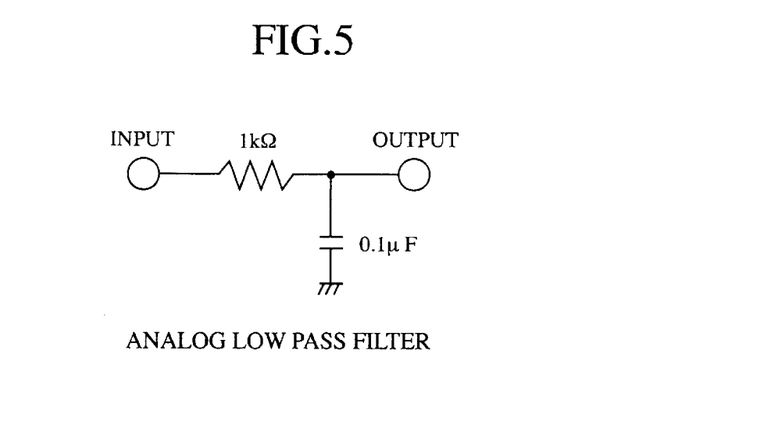
FIG. 5 shows an example of a low pass filter of the DTMF tone signal generator of the first embodiment of the present invention.

The circuit of FIG. 1 was realized using an FPGA in which fx=3.5795459 MHz, the number of bits of the frequency dividers 204 and 207 is 10, the number of bits of the counters 205 and 208 is 4 (period M=16), and the number of bits of the counter 212 is 8 (period 256). In addition, the circuit shown in FIG. 3 was used as the combining circuit 210. In the circuit of FIG. 3, a combining ratio can be varied by varying a shift amount. The combining circuit 210 is not limited to the circuit shown in FIG. 3, and it is also possible to use a multiplier such as that shown in FIG. 4. The RC first order filter shown in FIG. 5 was used as the analog low pass filter 211 external to the FPGA.

Figure 6:
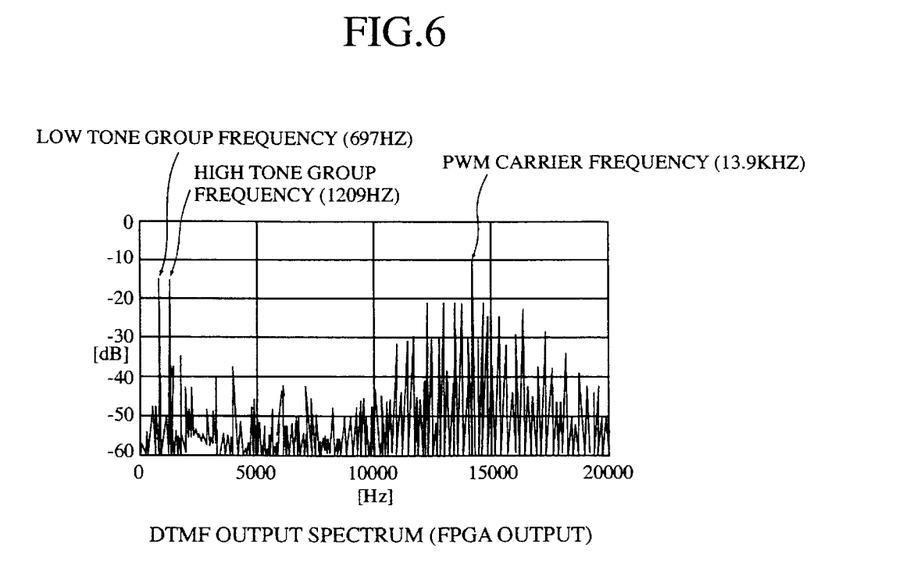
FIG. 6 shows an example of an FPGA (Field Programmable Gate Array) output spectrum of the DTMF tone signal generator of the first embodiment of the present invention.

FIG. 6 shows a spectrum of output 216 (302 in FIG. 2) from the FPGA (PWM modulated DTMF signal) when a low tone group frequency of 697 Hz and a high tone group frequency of 1209 Hz are generated by setting dividing ratio 1 to 321 and frequency dividing ratio 2 to 185. A PWM carrier frequency of 13.9 kHz (fx/256) is also included, so by cutting this out with the analog low pass filter 211 external to the FPGA it is possible to obtain a DTMF signal from which the PWM carrier frequency has been removed.

Figure 7:
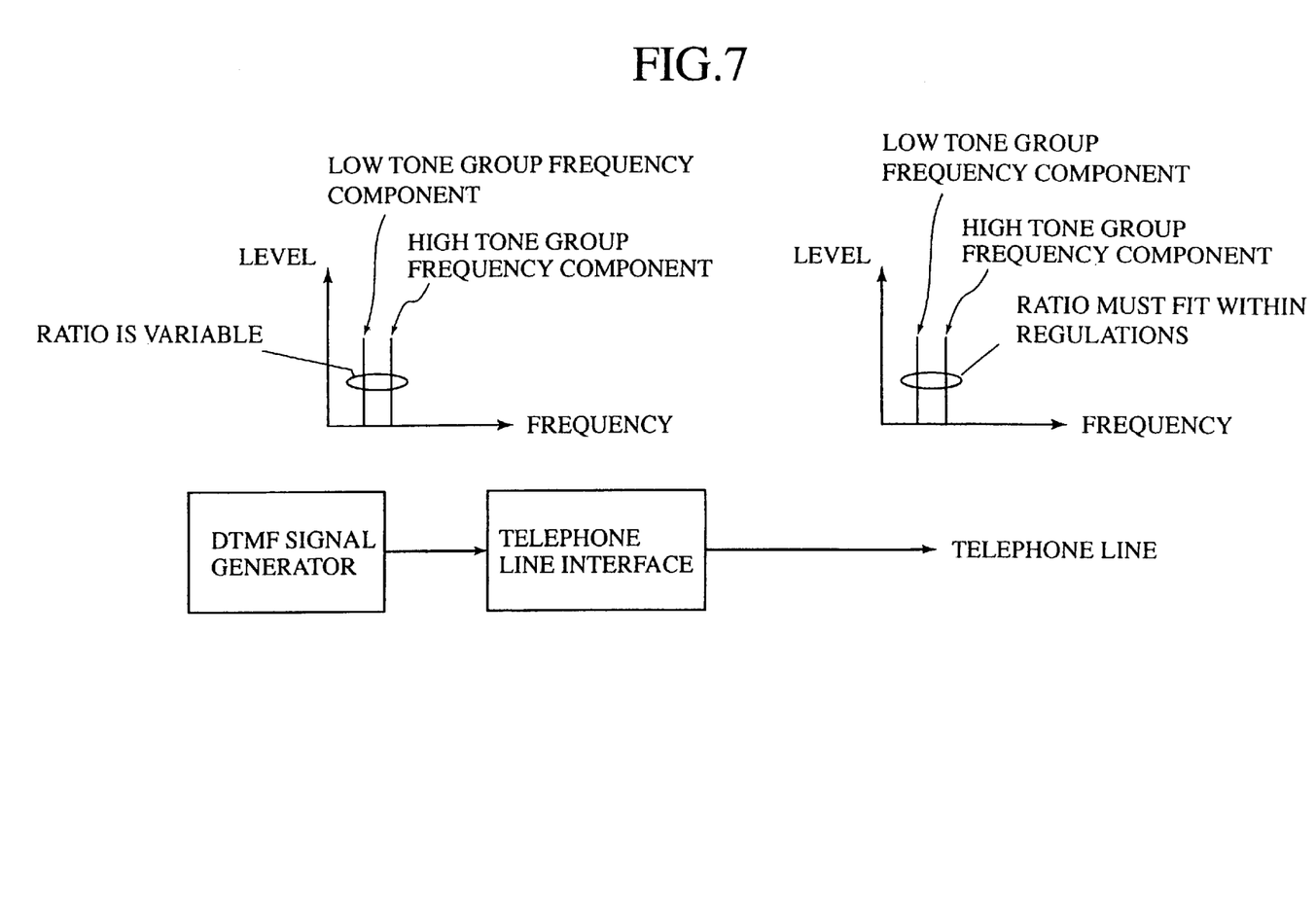
FIG. 7 is an explanatory view showing the operation of a device of the first embodiment of the present invention.

In this way, according to embodiment 1 of the present invention, by providing a combining circuit that can freely set a combining ratio for two sine waves, it is possible to increase the permissible range for frequency characteristic of a telephone line interface, and to lower cost and simplify design, as shown in FIG. 7.

In addition, according to embodiment 1 of the present invention, since a PWM modulator is provided, there is no need for a D/A converter and cost can be reduced.

Embodiment 2

Figure 8:
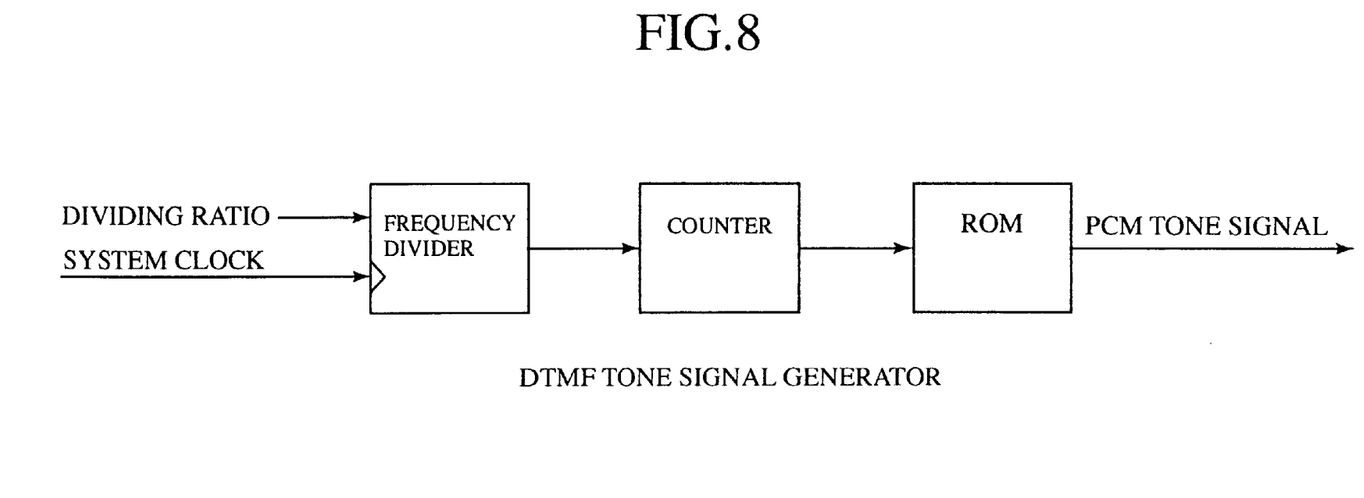
FIG. 8 is an explanatory view of a second embodiment of the present invention.
Figure 9:
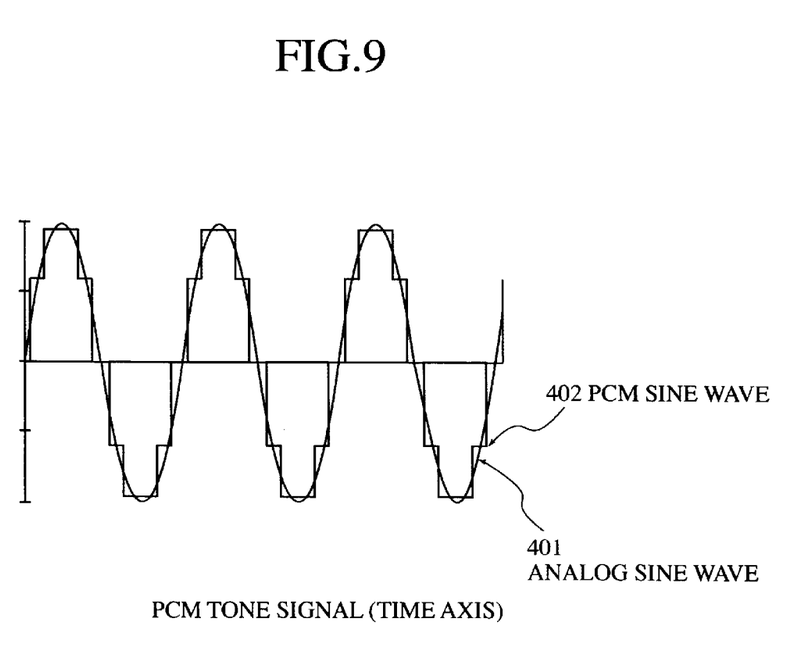
FIG. 9 is a waveform diagram for explaining the second embodiment of the present invention.
Figure 10:
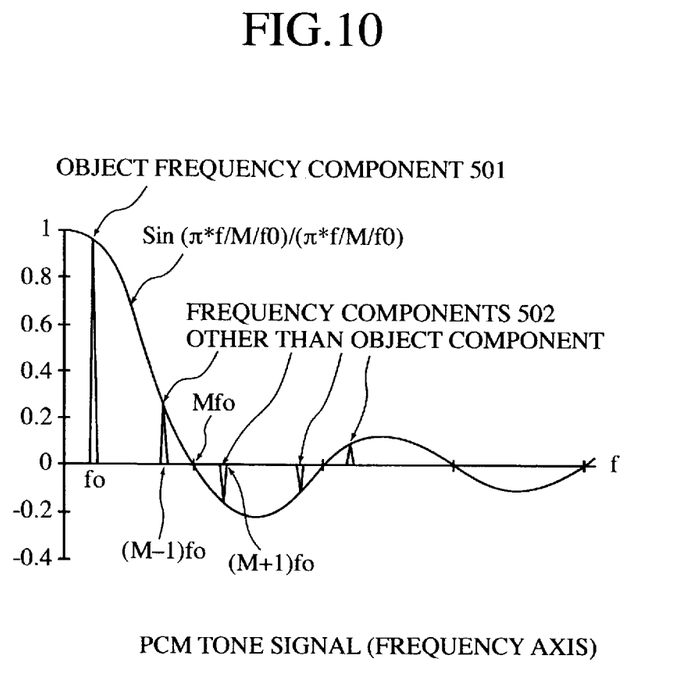
FIG. 10 is an output spectrum diagram for explaining the second embodiment of the present invention.

Part of the sine wave generator of embodiment 1 is shown again in FIG. 8. The output of this circuit has a stepped shape that approximates to the original sine wave 401. Because of this, as well as the originally required signal (tone) an undesired signal of a different frequency is also generated. This situation is shown in FIG. 10. For a frequency f0, object frequency component 501 exists, and for frequencies other than this, for example, (M−1) M, (M+1) M, etc., non-object frequency components exist. The levels of 501 and 502 obey the relationship sin $(\pi*f/M/f_0)/(\pi*f/M/f_0)$.

In the case where the tone signal generator of FIG. 8 is used to generate a DTMF signal, since the frequency precision of fs is preferably be within ±0.5%, N must be made at least 100. On the other hand, the non-object spectrum 502 is removed by making M large. Since fx can be expressed as fx=fsMN, if M is made large, then the system clock will require a higher frequency. Accordingly, M must be as small as possible in a range where the S/N ratio satisfies requirements. If the S/N ratio is calculated with respect to M, it becomes as follows.

S/N ratio with respect to M:
When M=8, S/N [dB]=15
When M=16, S/N [dB]=21
When M=32, S/N [dB]=27
When M=64, S/N [dB]=33

Accordingly, in order to obtain optimal results, referring to the above-described relationship between M and S/N ratio, it is best to select an optimum M for a desired S/N ratio. For example, M=16 satisfies a target S/N ratio and that would therefore be the most appropriate.

By using the DTMF signal generator of the present invention, it becomes possible to vary a ratio of signal levels for two sine waves which allows the permissible range for frequency characteristic of a telephone line interface to be increased, resulting in cost reduction and design simplification.

In addition, by providing a PWM modulator there is no longer any need for a D/A converter, resulting in possible further cost reduction.

What is claimed is:

1. A DTMF generator comprising:
    a first sine wave generator and a second sine wave generator for respectively generating sine waves of specified frequencies; and
    a combining circuit for combining and outputting outputs from the first and second sine wave generators at a specified combining ratio, the combining circuit including:
        at least one summing circuit; and
        at least one phase shifter,
        wherein the at least one phase shifter is controlled by the specified combining ratio, and
    wherein the specified combining ratio is variable.

2. A DTMF generator as disclosed in claim 1, further comprising:
    a PWM modulator for generating a pulse of a width corresponding to the output of the combining circuit; and
    a filter for removing unnecessary frequencies included in the output from the PWM modulator.

3. A DTMF generator as disclosed in claim 2, wherein the filter is an RC first order filter.

4. A DTMF generator as disclosed in claim 1, wherein the DTMF generator is incorporated into an ASIC.

5. A DTMF generator as disclosed in claim 1, wherein the DTMF generator is incorporated into an FPGA.

6. A DTMF generator as disclosed in claim 1, wherein the first and second sine wave generators include:

an oscillator;

a frequency divider;

a counter; and a memory device.

7. A method for generating DTMF tones comprising the steps of:

generating a first sine wave at a first specified frequency;

generating a second sine wave at a second specified frequency;

combining the first and second sine waves at a specified combining ratio; and outputting the combined first and second sine waves, wherein the specified combining ratio is variable, and wherein the step of combining includes using:

at least one summing circuit; and at least one phase shifter, wherein the at least one phase shifter is controlled by the specified combining ratio.

8. A method for generating DTMF tones as disclosed in claim 7, comprising the steps of:

generating a pulse of a width corresponding to the outputted combined first and second sine waves; and filtering the generated pulse to remove unnecessary frequencies.

9. A method for generating DTMF tones as disclosed in claim 7, wherein the first sine wave is generated by dividing a first oscillator wave by a first dividing ratio, counting the thus divided first oscillator wave, and outputting stored waveform data based upon the thus counted divided first oscillator wave, and wherein the second sine wave is generated by dividing a second oscillator wave by a second dividing ratio, counting the thus divided second oscillator wave, and outputting stored waveform data based upon the thus counted divided second oscillator wave.

10. A DTMF generator comprising:

a first sine wave generator and a second sine wave generator for respectively generating sine waves of specified frequencies; and a combining circuit for combining and outputting outputs from the first and second sine wave generators at a specified combining ratio, the combining circuit including:

at least one summing circuit; and at least one multiplying circuit, wherein the at least one multiplying circuit is controlled by the specified combining ratio, and wherein the specified combining ratio is variable.

11. A DTMF generator as disclosed in claim 10, further comprising:

a PWM modulator for generating a pulse of a width corresponding to the output of the combining circuit; and a filter for removing unnecessary frequencies included in the output from the PWM modulator.

12. A DTMF generator as disclosed in claim 11, wherein the filter is an RC first order filter.

13. A DTMF generator as disclosed in claim 10, wherein the DTMF generator is incorporated into an ASIC.

14. A DTMF generator as disclosed in claim 10, wherein the DTMF generator is incorporated into an FPGA.

15. A DTMF generator as disclosed in claim 10, wherein the first and second sine wave generators include:

an oscillator;

a frequency divider;

a counter; and a memory device.

16. A method for generating DTMF tones comprising the steps of:

generating a first sine wave at a first specified frequency;

generating a second sine wave at a second specified frequency;

combining the first and second sine waves at a specified combining ratio; and outputting the combined first and second sine waves, wherein the specified combining ratio is variable, and wherein the step of combining includes using:

at least one summing circuit; and at least one multiplying circuit, wherein the at least one multiplying circuit is controlled by the specified combining ratio.

17. A method for generating DTMF tones as disclosed in claim 16, further comprising the steps of:

generating a pulse of a width corresponding to the outputted combined first and second sine waves; and filtering the generated pulse to remove unnecessary frequencies.

18. A method for generating DTMF tones as disclosed in claim 16, wherein the first sine wave is generated by dividing a first oscillator wave by a first dividing ratio, counting the thus divided first oscillator wave, and outputting stored waveform data based upon the thus counted divided first oscillator wave, and wherein the second sine wave is generated by dividing a second oscillator wave by a second dividing ratio, counting the thus divided second oscillator wave, and outputting stored waveform data based upon the thus counted divided second oscillator wave.

* * * * *